US012757674B2

(12) United States Patent
Marumoto

(10) Patent No.: US 12,757,674 B2
(45) Date of Patent: Oct. 6, 2026

(54) SUBSTRATE PROCESSING APPARATUS AND SUBSTRATE PROCESSING METHOD

(71) Applicant: Tokyo Electron Limited, Tokyo (JP)

(72) Inventor: Hiroshi Marumoto, Koshi City (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 620 days.

(21) Appl. No.: 18/188,715

(22) Filed: Mar. 23, 2023

(65) Prior Publication Data

US 2023/0307271 A1 Sep. 28, 2023

(30) Foreign Application Priority Data

Mar. 24, 2022 (JP) ................................. 2022-048688

(51) Int. Cl.
*H10P 72/00* (2026.01)
*B08B 3/02* (2006.01)
(Continued)

(52) U.S. Cl.
CPC .............. *H10P 72/06* (2026.01); *B08B 3/022* (2013.01); *B08B 13/00* (2013.01); *G06T 7/0008* (2013.01);
(Continued)

(58) Field of Classification Search
CPC ......... H01L 21/67242; H01L 21/67023; H01L 21/6715; H01L 21/67253; H01L 21/67259;
(Continued)

(56) References Cited

U.S. PATENT DOCUMENTS 10,748,798 B1 8/2020 Tsai et al.
2009/0292491 A1* 11/2009 Fukuoka ........... H01L 21/67253 118/712
(Continued)

FOREIGN PATENT DOCUMENTS

JP H11-329936 A 11/1999
JP 4607848 B2 * 1/2011 ....... H01L 21/67259
(Continued)

OTHER PUBLICATIONS

Machine translation of JP-4607848-B2 (Year: 2011).*
Machine translation of JP-2017045922-A (Year: 2017).*
Machine translation of JP-2012104732-A (Year: 2012).*

*Primary Examiner* — Erin F Bergner
(74) *Attorney, Agent, or Firm* — Chrisman Gallo Tochtrop LLC

(57) ABSTRACT

A substrate processing apparatus includes an inspection substrate including a base and an imaging unit disposed at the base; a holder configured to hold a substrate or the inspection substrate; a driving unit configured to rotate the holder; a processing liquid supply having a nozzle configured to discharge a processing liquid to the substrate held by the holder; and a controller. The controller is configured to perform: adjusting a position of the imaging unit with respect to the nozzle to a predetermined first imaging position by controlling the driving unit to rotate the holder in a state that the inspection substrate is held by the holder; and imaging, after the adjusting of the position of the imaging unit to the first imaging position, the nozzle at the first imaging position by controlling the imaging unit.

17 Claims, 15 Drawing Sheets

(51) Int. Cl.
*B08B 13/00* (2006.01)
*G06T 7/00* (2017.01)
*G06T 7/50* (2017.01)

(52) U.S. Cl.
CPC ............ *G06T 7/50* (2017.01); *H10P 72/0404* (2026.01); *G06T 2207/30148* (2013.01); *G06T 2207/30164* (2013.01)

(58) Field of Classification Search
CPC ......... H01L 21/68714; H01L 21/67017; H01L 22/12; B08B 3/022; B08B 13/00; G06T 7/0008; G06T 7/50; G06T 2207/30148; G06T 2207/30164; G06T 7/001; B05B 12/08
See application file for complete search history.

(56) References Cited

U.S. PATENT DOCUMENTS

| | | | | |
|---|---|---|---|---|
| 2012/0084059 | A1* | 4/2012 | Akada | H01L 21/67253 702/188 |
| 2019/0019701 | A1 | 1/2019 | Hayakawa | |
| 2020/0006101 | A1* | 1/2020 | Chen | H01L 21/67248 |
| 2022/0005736 | A1* | 1/2022 | Naohara | G06T 7/11 |

FOREIGN PATENT DOCUMENTS

| | | | | | |
|---|---|---|---|---|---|
| JP | 2012104732 | A | * | 5/2012 | G03F 7/16 |
| JP | 2017045922 | A | * | 3/2017 | |
| WO | WO-2020071206 | A1 | * | 4/2020 | B05D 3/10 |

* cited by examiner

SUBSTRATE PROCESSING APPARATUS AND SUBSTRATE PROCESSING METHOD

CROSS-REFERENCE TO RELATED APPLICATION

This application claims the benefit of Japanese Patent Application No. 2022-048688 filed on Mar. 24, 2022, the entire disclosure of which is incorporated herein by reference.

TECHNICAL FIELD

The various aspects and embodiments described herein pertain generally to a substrate processing apparatus and a substrate processing method.

BACKGROUND

Patent Document 1 discloses a substrate processing apparatus including a holder configured to hold a substrate, a scattering prevention cup disposed around the holder, a processing liquid supply nozzle configured to supply a processing liquid to the substrate held by the holder, an imaging device disposed above the processing liquid supply nozzle and the scattering prevention cup to image a supply path for the processing liquid between the processing liquid supply nozzle and a surface of the substrate, and a control device configured to perform a predetermined operation when a supply state of the processing liquid obtained by the imaging device is abnormal.

Patent Document 1: Japanese Patent Laid-open Publication No. H11-329936

SUMMARY

In one exemplary embodiment, a substrate processing apparatus includes an inspection substrate including a base and an imaging unit disposed at the base; a holder configured to hold a substrate or the inspection substrate; a driving unit configured to rotate the holder; a processing liquid supply having a nozzle configured to discharge a processing liquid to the substrate held by the holder; and a controller. The controller is configured to perform: adjusting a position of the imaging unit with respect to the nozzle to a predetermined first imaging position by controlling the driving unit to rotate the holder in a state that the inspection substrate is held by the holder; and imaging, after the adjusting of the position of the imaging unit to the first imaging position, the nozzle at the first imaging position by controlling the imaging unit.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 8A illustrates an example of a taken image when an imaging position is 0°; FIG. 8B is a graph showing a variation of a luminance value in a horizontal direction at a predetermined position of the taken image of FIG. 8A; FIG. 8C illustrate an example of a taken image when the imaging position is 90°; and FIG. 8D is a graph showing a variation of a luminance value in a horizontal direction at a predetermined position of the taken image of FIG. 8C;

FIG. 9A illustrates an example of a taken image when the imaging position is 180°; FIG. 9B is a graph showing a variation of a luminance value in a horizontal direction at a predetermined position of the taken image of FIG. 9A; FIG. 9C illustrate an example of a taken image when the imaging position is 270°; and FIG. 9D is a graph showing a variation of a luminance value in a horizontal direction at a predetermined position of the taken image of FIG. 9C;

FIG. 10A illustrates an example of a taken image when the imaging position is 0°; FIG. 10B illustrates an example of a taken image when the imaging position is 90°; FIG. 10C illustrates an example of a taken image when the imaging position is 180°; and FIG. 10D illustrates an example of a taken image when the imaging position is 270°;

DETAILED DESCRIPTION

Figure 1:
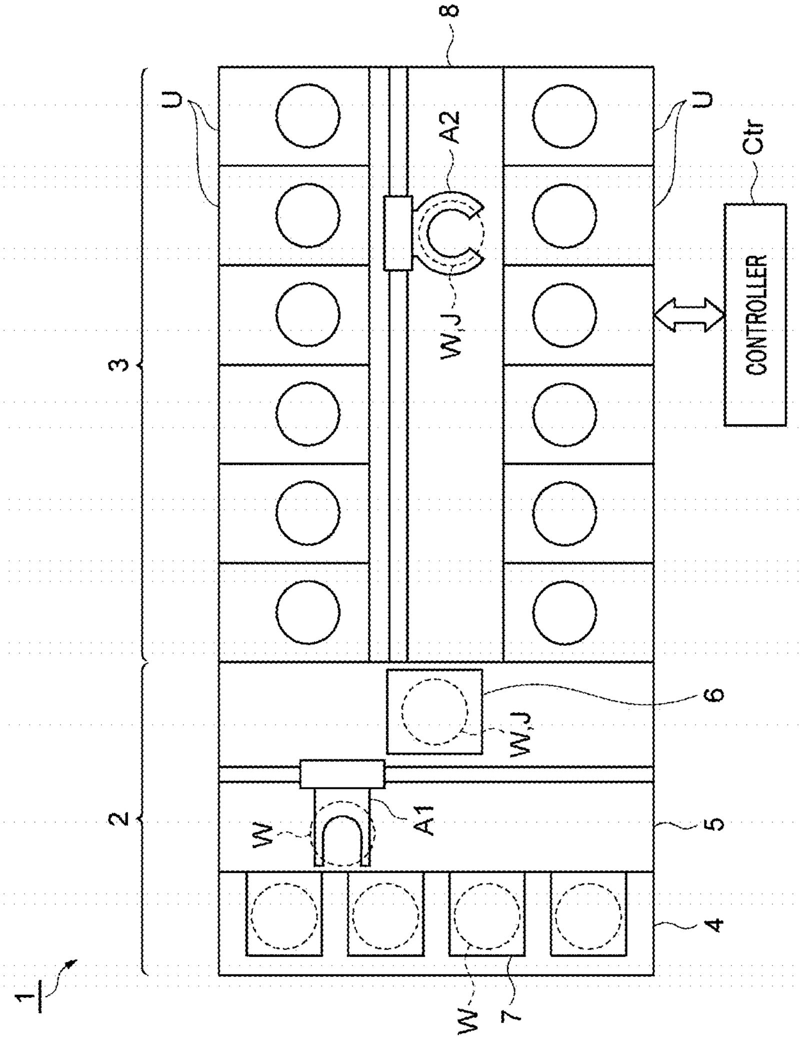
FIG. 1 is a plan view schematically illustrating an example of a substrate processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

In the following description, same parts or parts having same functions will be assigned same reference numerals, and redundant description thereof will be omitted. Further, in the present specification, when referring to the top, bottom, right, and left of the drawings, the directions of the symbols in the drawings shall be used as a reference.

Substrate Processing System

First, referring to FIG. 1, a configuration of a substrate processing system 1 (substrate processing apparatus) configured to process a substrate W will be explained. The substrate processing system 1 includes a carry-in/out station 2, a processing station 3, and a controller Ctr (control unit). The carry-in/out station 2 and the processing station 3 may be arranged in a row in a horizontal direction, for example.

The substrate W may have a circular plate shape, or may have a plate shape other than the circular shape, such as a polygonal shape. The substrate W may have a groove portion where a part of the substrate W is cut out. The groove portion may be, by way of example, a notch (a U-shaped or V-shaped groove, or the like), or may be a straight line-shaped portion (a so-called orientation flat) extending in a straight line shape. The substrate W may be, by way of non-limiting example, a semiconductor substrate (silicon wafer), a glass substrate, a mask substrate, a FPD (Flat Panel Display) substrate, or any of various other types of substrates. The substrate W may have a diameter ranging from, e.g., about 200 mm to about 450 mm.

The carry-in/out station 2 includes a placing section 4, a carry-in/out section 5, and the shelf unit 6 (accommodation chamber). The placing section 4 includes a plurality of placement tables (not shown) arranged in a width direction (an up-and-down direction in FIG. 1) thereof. Each placement table is configured to place a carrier 7 thereon. The carrier 7 is configured to accommodate at least one substrate W in a sealed state. The carrier 7 includes an opening/closing door (not shown) through which the substrate W is carried in and out.

The carry-in/out section 5 is disposed adjacent to the placing section 4 in a direction in which the carry-in/out station 2 and the processing station 3 are arranged (in a left-and-right direction in FIG. 1). The carry-in/out section 5 includes an opening/closing door (not shown) that is provided for the placing section 4. With the carrier 7 placed on the placing section 4, both the opening/closing door of the carrier 7 and the opening/closing door of the carry-in/out section 5 are opened, allowing the inside of the carry-in/out section 5 and the inside of the carrier 7 to communicate with each other.

The carry-in/out section 5 incorporates therein a transfer arm A1 and the shelf unit 6. The transfer arm A1 is configured to be movable horizontally in a width direction of the carry-in/out section 5, movable up and down in a vertical direction, and pivotable around a vertical axis. The transfer arm A1 is configured to take out the substrate W from the carrier 7 to hand it over to the shelf unit 6, and, also, configured to receive the substrate W from the shelf unit 6 to return it back into the carrier 7. The shelf unit 6 is located in the vicinity of the processing station 3, and is configured to accommodate therein the substrate W and an inspection substrate J (which is to be described in detail later).

The processing station 3 includes a transfer section 8 and a plurality of liquid processing units U. The transfer section 8 extends horizontally in the direction in which the carry-in/out station 2 and the processing station 3 are arranged (the left-and-right direction in FIG. 1), for example. The transfer section 8 has a transfer arm A2 (transfer unit) provided therein. The transfer arm A2 is configured to be movable in a lengthwise direction of the transfer section 8, movable up and down in a vertical direction, and pivotable around a vertical axis. The transfer arm A2 is configured to take out the substrate W or the inspection substrate J from the shelf unit 6 to hand it over to the liquid processing unit U, and, also, configured to receive the substrate W or the inspection substrate J from the liquid processing unit U to return it back into the shelf unit 6.

Liquid Processing Unit

Figure 2:
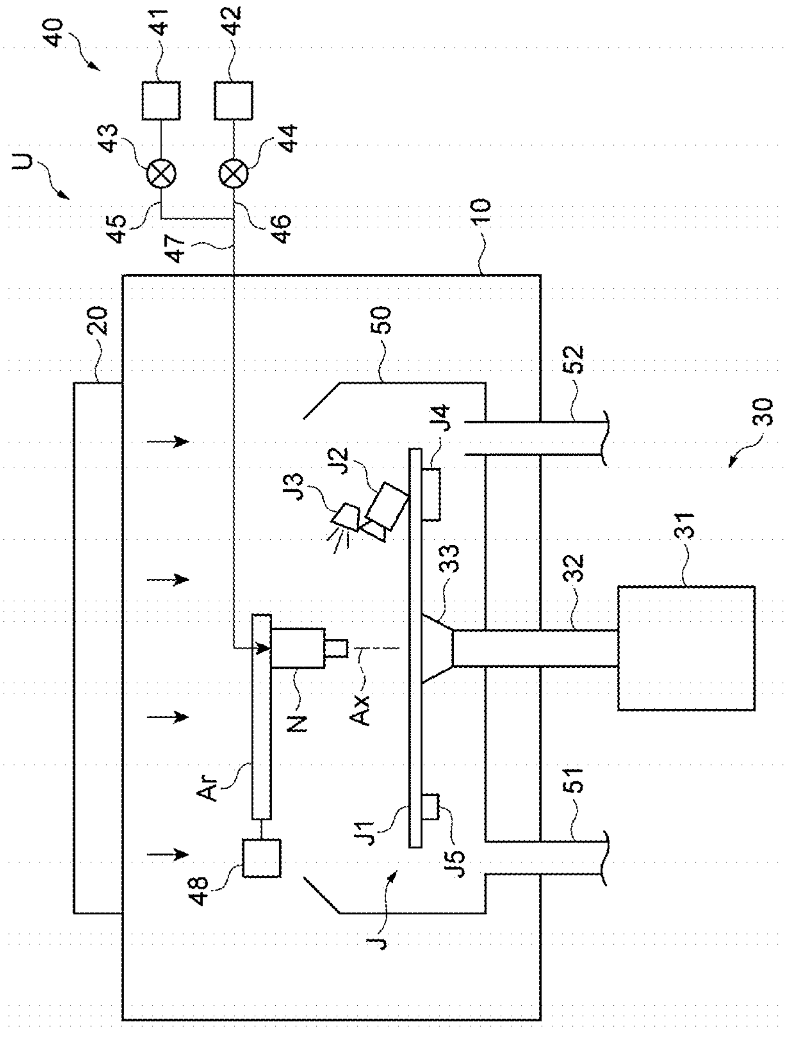
FIG. 2 is a side view schematically illustrating an example of a liquid processing unit.

Now, referring to FIG. 2, the liquid processing unit U will be explained in detail. The liquid processing unit U is configured to perform a preset liquid processing (for example, removal of contaminants or foreign matters, etching, etc.) on the substrate W. The liquid processing unit U may be, for example, a single-wafer type cleaning apparatus configured to clean the substrates W one by one by spin-cleaning.

The liquid processing unit U includes a chamber 10 (processing chamber), a blower 20, a rotating/holding unit 30, a supply 40 (a processing liquid supply and a cleaning liquid supply), and a cup member 50.

The chamber 10 is a housing configured such that the substrate W or the inspection substrate J can be carried into or out of it. A non-illustrated carry-in/out opening is formed in a sidewall of the chamber 10. The substrate W or the inspection substrate J is carried into the chamber 10 and carried out from the chamber 10 by a transfer arm A2 through the carry-in/out opening.

The blower 20 is provided at a ceiling wall of the chamber 10. The blower 20 is configured to form a descending flow in the chamber 10 based on a signal from the controller Ctr.

The rotating/holding unit 30 includes a driving unit 31, a shaft 32, and a holder 33. The driving unit 31 is operated based on an operation signal from the controller Ctr to rotate the shaft 32. The driving unit 31 may be, by way of example, a power source such as an electric motor.

The holder 33 is provided at a leading end of the shaft 32. The holder 33 is configured to attract and hold a rear surface of the substrate W or the inspection substrate J by, for example, attraction. That is, the rotating/holding unit 30 may be configured to rotate the substrate W or the inspection substrate J around a rotation axis Ax perpendicular to a front surface of the substrate W or the inspection substrate J, while keeping the substrate W or the inspection substrate J in a substantially horizontal posture.

The supply 40 is configured to supply a plurality of different kinds of processing liquids to the front surface of the substrate W from a nozzle N. The supply 40 includes liquid sources 41 and 42, valves 43 and 44, pipelines 45 to 47, the nozzle N, an arm Ar, and a driving unit 48 (nozzle driving unit).

The liquid source 41 may be configured as a source of a processing liquid. The processing liquid may be an acidic liquid or an alkaline liquid. The acidic liquid may include, by way of non-limiting example, a SC-2 solution (a mixture of hydrochloric acid, hydrogen peroxide, and pure water), SPM (a mixture of sulfuric acid and hydrogen peroxide), a HF liquid (hydrofluoric acid), a DHF liquid (dilute hydrofluoric acid), a $HF/HNO_3$ solution (a mixture of hydrofluoric acid and nitric acid), or the like. The alkaline liquid may contain, by way of non-limiting example, a SC-1 solution (a mixture of ammonia, hydrogen peroxide, and pure water), hydrogen peroxide, or the like. The liquid source 41 is connected to the nozzle N through the pipelines 45 and 47.

The liquid source 42 may be configured as a source of a cleaning liquid. The cleaning liquid may be, for example, an organic cleaning liquid or a rinse liquid. The organic cleaning liquid may contain, by way of non-limiting example, IPA (isopropyl alcohol) or the like. The rinse liquid may contain, for example, pure water (DIW: deionized water), ozone water, carbonated water ($CO_2$ water), ammonia water, or the like. The liquid source 42 is connected to the nozzle N through the pipelines 46 and 47.

The pipelines 45 and 46 are provided with the valves 43 and 44, respectively. Each of the valves 43 and 44 is configured to be opened or closed based on an operation signal from the controller Ctr.

The nozzle N is held by the arm Ar. The arm A4 is connected with the driving unit 48. The driving unit 48 is operated based on an operation signal from the controller Ctr to move the arm Ar horizontally or to move it up and down. Accordingly, the nozzle N is configured to be moved horizontally or to be moved up and down above the substrate W. The driving unit 48 is operated based on an operation signal from the controller Ctr, and may be configured to change an angle of the arm Ar with respect to a vertical axis. In this case, an angle of the nozzle N also changes along with the change in the angle of the arm Ar with respect to the vertical axis. That is, the posture (a horizontal position, a vertical position, or an angle) of the nozzle N may be adjusted by driving the arm Ar with the driving unit 48.

When the processing liquid or the cleaning liquid is discharged from the nozzle N to the front surface of the substrate W, the nozzle N may be disposed above the substrate W such that a discharge opening thereof is directed to the front surface of the substrate W. Further, when inspection of a state of the nozzle N to be described later is performed, the nozzle N may be disposed above the inspection substrate J such that the discharge opening thereof is directed to the front surface of the inspection substrate J.

The cup member 50 is disposed so as to surround the holder 33. The cup member 50 is configured to collect the processing liquid scattered from an outer periphery of the substrate W to the vicinity thereof when the substrate W is held and rotated by the rotating/holding unit 30. A drain port 51 and an exhaust port 52 are provided at a bottom of the cup member 50.

The drain port 51 is configured to drain the processing liquid or the cleaning liquid collected by the cup member 50 to the outside of the liquid processing unit U. The exhaust port 52 is configured to exhaust the descending flow formed around the substrate W by the blower 20 to the outside of the liquid processing unit U. The descending flow is accompanied by a gas generated around the substrate W as the substrate W is processed by the processing liquid.

Inspection Substrate

The inspection substrate J is configured to inspect the state of the nozzle N. The inspection substrate J includes, as illustrated in FIG. 2, a base J1, an imaging unit J2, an illuminator J3, a battery J4, and a communication unit J5. Like the substrate W, the base J1 may have a disk shape, or may have a plate shape other than the circular shape, such as a polygon. The base J1 holds thereon the imaging unit J2, the illuminator J3, the battery J4, and the communication unit J5.

The imaging unit J2 is operated based on an operation signal from the controller Ctr, and is configured to image the appearance of the nozzle N. The imaging unit J2 may be, for example, a CCD camera or a CMOS camera. The imaging unit J2 is disposed on the base J1. The imaging unit J2 may be disposed on the base J1 such that it may be located closer to the outer periphery of the base J1 than the nozzle N is when it images the nozzle N. The imaging unit J2 is configured such that an elevation thereof is adjustable by a non-illustrated driving unit. The elevation may be in a range of, e.g., 0° to 90°.

The illuminator J3 is operated based on an operation signal from the controller Ctr, and is configured to radiate light to the nozzle N when the nozzle N is imaged by the imaging unit J2. The illuminator J3 is disposed on the base J1. The illuminator J3 may be disposed near the imaging unit J2.

The battery J4 is configured to supply electric power to the electronic devices provided on the inspection substrate J. To charge the battery J4, a charging port may be provided at the shelf unit 6, for example. In this case, the battery J4 is charged through the charging port in the state that the inspection substrate J is retreated to the shelf unit 6 and kept therein. The way to charge the battery J4 may be contact type charging in which the charging is performed as the battery comes into contact with a metal terminal of the charging port, or non-contact type charging in which the electric power is transmitted to the battery J4 without passing through a metal terminal or the like.

The communication unit J5 is configured to be capable of communicating with the controller Ctr (for example, a processing unit M3 to be described later). The communication unit J5 is capable of receiving the operation signals for operating the imaging unit J2 and the illuminator J3 from the controller Ctr. The communication unit J5 is capable of transmitting data of the image taken by the imaging unit J2 to the controller Ctr. The way for the communication between the communication unit J5 and the controller Ctr is not particularly limited, and it may be, for example, wireless communication or wired communication (via a communication cable). As an example of the wireless communication, LTE (Long Term Evolution), LTE-A (LTE-Advanced), SUPER3G, IMT-Advanced, 4G, 5G, FRA (Future Radio Access), W-CDMA (registered trademark), GSM (registered trademark), CDMA2000, UMB (Ultra Mobile Broadband), IEEE 802.11 (Wi-Fi), IEEE 802.16 (WiMAX), IEEE 802.20, UWB, Bluetooth (registered trademark), or any of various other communication methods may be used.

Details of Controller

Figure 3:
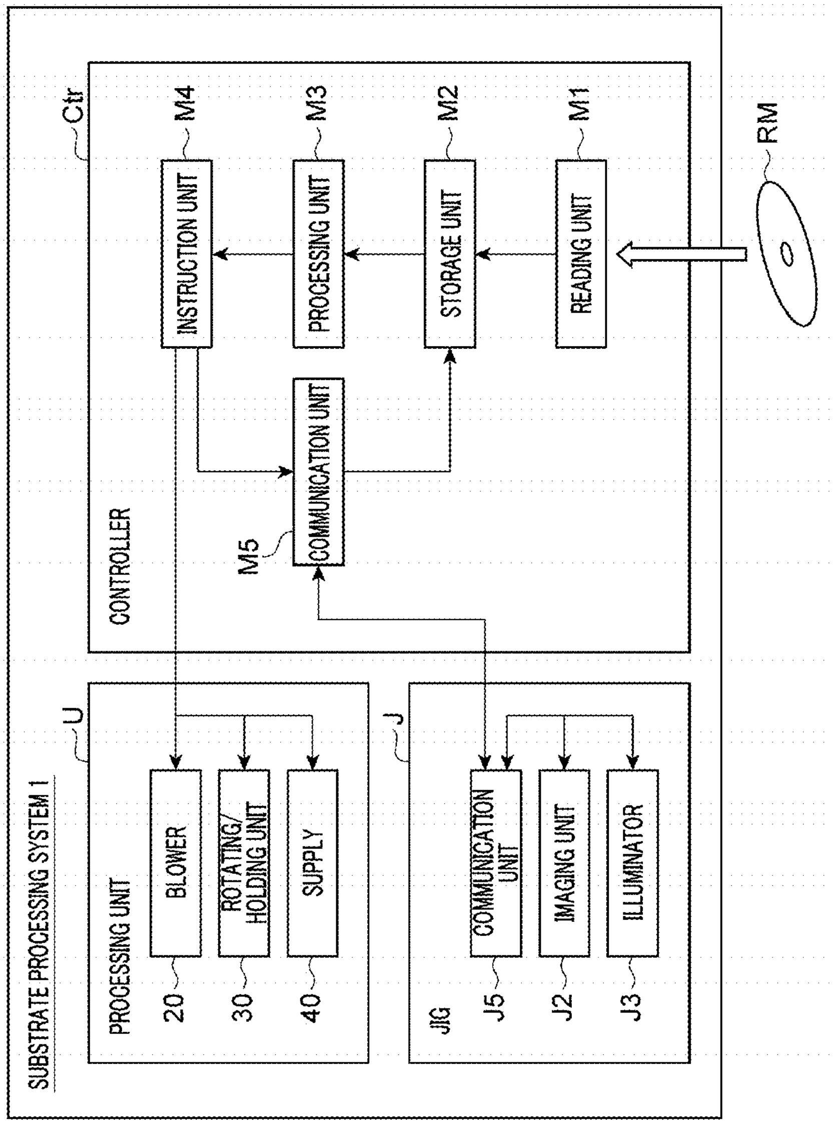
FIG. 3 is a block diagram illustrating an example of main components of the substrate processing system.

The controller Ctr is configured to control the substrate processing system 1 partially or in overall. As illustrated in FIG. 3, the controller Ctr has, as functional modules, a reading unit M1, a storage unit M2, the processing unit M3, an instruction unit M4, and a communication unit M5. These functional modules are nothing more than divisions of functions of the controller Ctr for convenience's sake, and it does not necessarily imply that hardware constituting the controller Ctr is divided into these modules. Each functional module is not limited to being implemented by execution of a program but may be implemented by a dedicated electric circuit (for example, a logic circuit) or an ASIC (Application Specific Integrated Circuit) as an integration of these electric circuits.

The reading unit M1 is configured to read a program from a computer-readable recording medium RM. The recording medium RM stores thereon a program for operating the individual components of the substrate processing system 1. The recording medium RM may be, by way of example, but not limitation, a semiconductor memory, an optical recording disk, a magnetic recording disk, a magneto-optical recording disk, or the like. Further, in the following, each component of the substrate processing system 1 may include individual components of the blower 20, the rotating/holding unit 30, the supply 40, the imaging unit J2, the illuminator J3, and the communication unit J5.

The storage unit M2 is configured to store therein various kinds of data. The storage unit M2 may store therein, for example, the program read out from the recording medium RM by the reading unit M1, setting data inputted from an operator via an external input device (not shown), and the like. The storage unit M2 may also store therein, for example, data of processing conditions (processing recipes) for processing the substrate W. The storage unit M2 may further store therein, for example, data of the image of the imaging unit J2 transmitted via the communication units J5 and M5.

The processing unit M3 is configured to process various types of data. By way of example, the processing unit M3 may generate signals for operating the individual components of the substrate processing system 1 based on the various types of data stored in the storage unit M2. As another example, the processing unit M3 may generate an operation signal for causing the imaging unit J2 to start or stop the imaging. For another example, the processing unit M3 may generate an operation signal for adjusting the elevation and a focus of the imaging unit J2. As still another example, the processing unit M3 may generate an operation signal for causing the illuminator J3 to start or stop the radiation of light.

The processing unit M3 may calculate the state of the nozzle N based on, for example, the data of the image taken by the imaging unit J2. The state of the nozzle N may include, for example, a posture of the nozzle (a height of the nozzle N, a center position of a leading end of the nozzle N, an inclination of the nozzle N, etc.), an abnormality on a surface of the nozzle N, and so forth. The processing unit M3 may calculate an expected liquid landing position of the processing liquid discharged from the nozzle N on the front surface of the substrate W based on the calculated posture of the nozzle N. The processing unit M3 may calculate a deviation between the calculated expected liquid landing position and the rotation axis Ax of the rotating/holding unit 30. When the calculated deviation is out of a preset range or when there is an abnormality on the surface of the nozzle N, the processing unit M3 may set forth an alarm from a non-illustrated notification unit (for example, an alarm may be displayed on a display, or an alarming sound or an alarming message may be emitted from a speaker).

The instruction unit M4 is configured to transmit the operation signals generated in the processing unit M3 to the individual components of the substrate processing system 1. The communication unit M5 is configured to be capable of communicating with the communication unit J5, as stated above. When the communication unit M5 performs wireless communication with the communication unit J5, the communication unit M5 may be configured in the same way as the communication unit J5.

Figure 4:
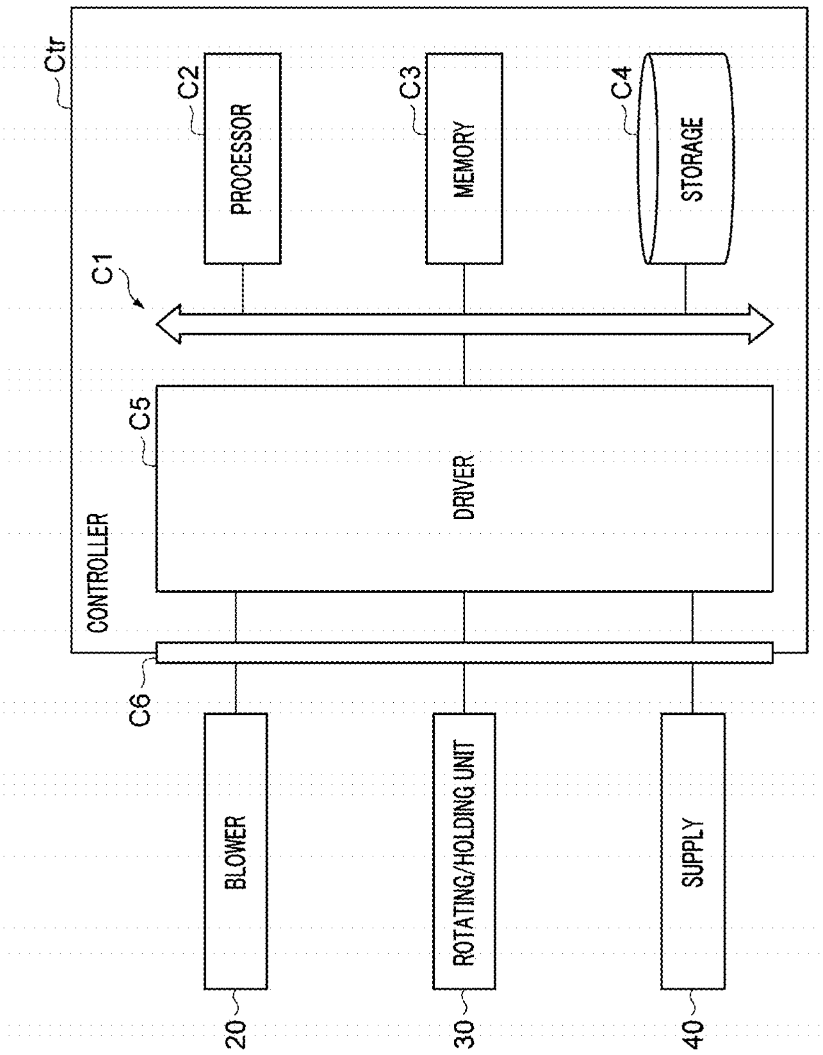
FIG. 4 is a schematic diagram illustrating an example of a hardware configuration of a controller.

The hardware of the controller Ctr may be composed of, by way of example, one or more control computers. The controller Ctr may include a circuit C1 as a hardware component, as shown in FIG. 4. The circuit C1 may be composed of electric circuit elements (circuitry). The circuit C1 may include, by way of example, a processor C2, a memory C3, a storage C4, a driver C5, and an input/output port C6.

The processor C2 may be configured to execute a program in cooperation with at least one of the memory C3 and the storage C4 and to perform an input/output of signals via the input/output port C6, thus realizing the aforementioned individual functional modules. The memory C3 and the storage C4 serve as the storage unit M2. The driver C5 may be a circuit configured to drive the individual components of the substrate processing system 1. The input/output port C6 may be configured to relay the input/output of the signals between the driver C5 and the individual components of the substrate processing system 1.

The substrate processing system 1 may be equipped with one controller Ctr or a controller group (control unit) composed of a multiple number of controllers Ctr. When the substrate processing system 1 is equipped with the controller group, each of the aforementioned functional modules may be implemented by a single controller Ctr or a combination of two or more controllers Ctr. If the controller Ctr is composed of a plurality of computers (circuits C1), each of the aforementioned functional modules may be implemented by a single computer (circuit C1) or a combination of two or more computers (circuits C1). The controller Ctr may include a plurality of processors C2. In this case, each of the aforementioned functional modules may be implemented by a single processor C2 or a combination of two or more processors C2.

Method of Inspecting State of Nozzle

Next, with reference to FIG. 5 to FIG. 11, an example method of inspecting the state of the nozzle N will be explained. The following description will be provided for an example where the inspection is started in the state that the inspection substrate J is placed in the shelf unit 6. Further, the image taken by the imaging unit J2 may be a gray scale image or a color image.

First, the controller Ctr controls the transfer arm A2 to transfer the inspection substrate J from the shelf unit 6 to the liquid processing unit U. Then, the inspection substrate J is held by the rotating/holding unit 30 of the liquid processing unit U (see process S1 of FIG. 5). Next, the controller Ctr controls the driving unit of the nozzle N to move the nozzle N so that the nozzle N is located at an origin.

In addition, the origin is set such that the liquid landing position is substantially coincident with the rotation axis Ax (center of the substrate W) when the processing liquid or the cleaning liquid is discharged onto the front surface of the substrate W from the nozzle N located at the origin. However, even when the nozzle N is located at the origin, the liquid landing position may sometimes be deviated from the rotation axis Ax by being affected by the inclination of the nozzle N, misalignment of the arm Ar, or the like. In addition, the height position of the leading end of the nozzle N when the nozzle N is located at the origin may be deviated from a predetermined set position due to an influence of an inclination of the arm Ar or the like.

Figure 5:
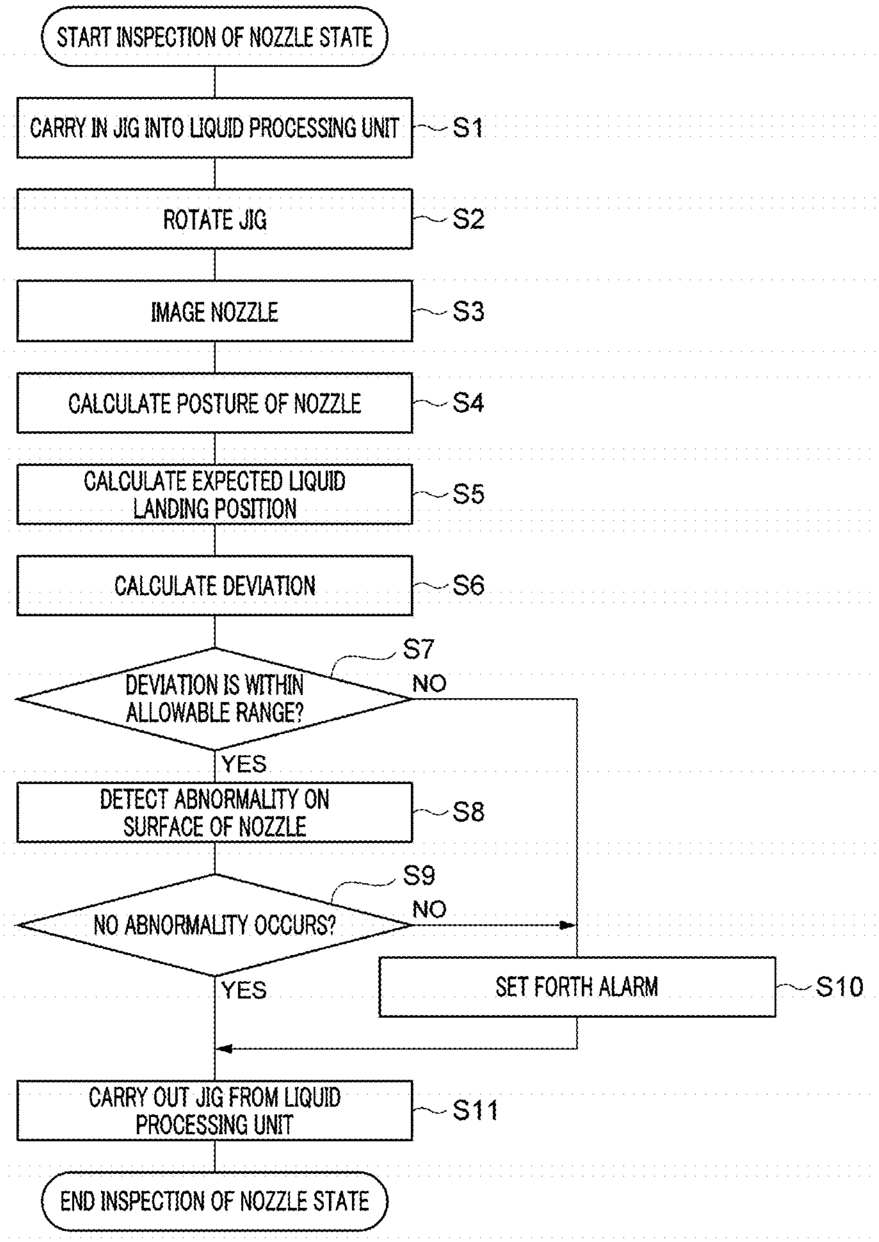
FIG. 5 is a flowchart for describing an example of a sequence of inspecting a state of a nozzle.

Thereafter, the controller Ctr controls the rotating/holding unit 30 to rotate the inspection substrate J via the rotating/holding unit 30 so that the imaging unit J2 for the nozzle N is positioned at a predetermined imaging position P1 (see FIG. 6) (see process S2 of FIG. 5). Here, when the imaging unit J2 is already located at the imaging position P1 at the time when the inspection substrate J is handed over to the rotating/holding unit 30 from the transfer arm A2, the process S2 may not be performed.

Subsequently, the controller Ctr controls the imaging unit J2 and the illuminator J3 via the communication units M5 and J5 so that the nozzle N is imaged by the imaging unit J2 while the light is radiated to the nozzle N by the illuminator J3 (see process S3 of FIG. 5). The data of the taken image is transmitted to the controller Ctr via the communication units M5 and J5. Further, before the nozzle N is imaged, the controller Ctr may control the imaging unit J2 via the communication units M5 and J5 to adjust the elevation and the focus of the imaging unit J2.

Figure 6:
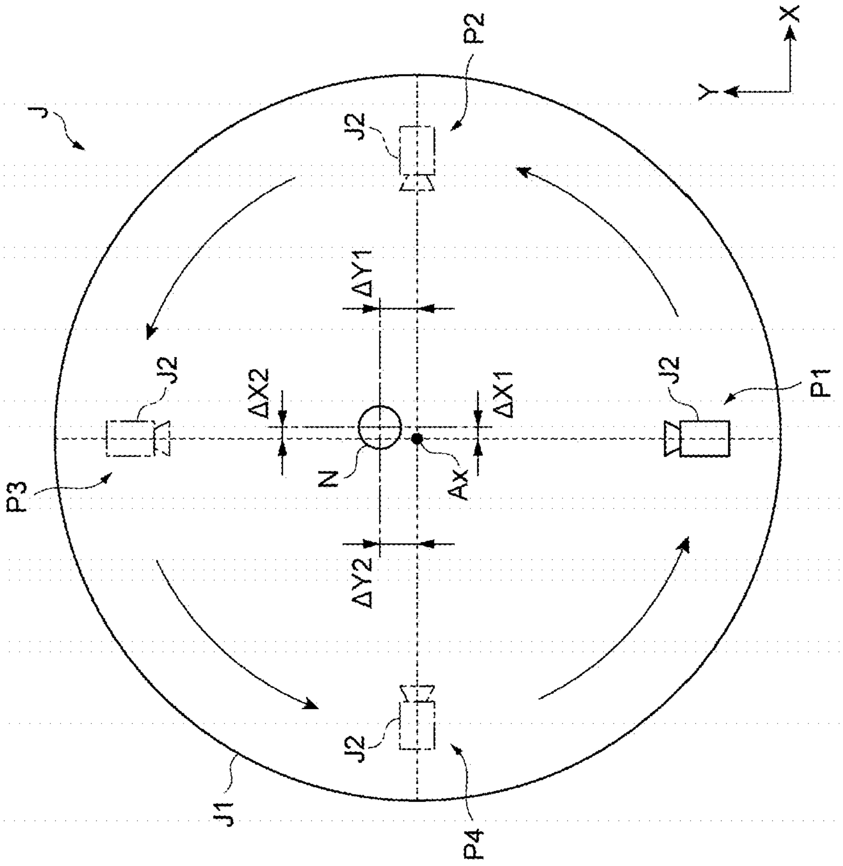
FIG. 6 is a top view of an inspection substrate for describing an example of adjustment of an imaging position.

The processes S2 and S3 may be repeated when necessary for the inspection, and while varying the imaging position, the nozzle N may be imaged by the imaging unit J2 from different directions. For example, as shown in FIG. 6, the imaging unit J2 may image the nozzle N from different imaging positions P1 to P4 at an angular interval of approximately 90°. In this case, four images respectively taken from the imaging positions P1 to P4 are obtained. Alternatively, although not shown, the nozzle N may be imaged by the imaging unit J2 from different imaging positions at an angular interval of approximately 15°. In this case, twenty four images respectively taken from the respective imaging positions are obtained. Still alternatively, although not shown, the nozzle N may be imaged by the imaging unit J2 continuously while rotating the inspection substrate J. In this case, an image (so-called panoramic image) for the entire circumference of the nozzle N is obtained. Further, when imaging the nozzle N from different directions while changing the imaging position, these multiple imaging positions may be spaced apart from each other at a substantially equal interval therebetween in a rotational direction of the inspection substrate J (that is, may be spaced apart from each other at each preset angle), or the interval may not be uniform.

Next, the controller Ctr calculates the posture of the nozzle N by processing the data of at least one image taken by the imaging unit J2 (see process S4 of FIG. 5). Here, an example where (A) the height of the nozzle N, (B) the center position of the leading end of the nozzle N, and (C) the inclination of the nozzle N are calculated as the posture of the nozzle N will be discussed.

(A) Height of Nozzle N

First, a lowermost end (see FIG. 7) of the nozzle N is specified from the taken image. To specify the lowermost end of the nozzle N, a method in which an operator observes the taken image and specifies the lowermost end of the nozzle N, or a method in which the controller Ctr processes the taken image by using a commonly known edge detection technique and detects the lowermost end the nozzle N based on the processed image may be employed.

Figure 7:
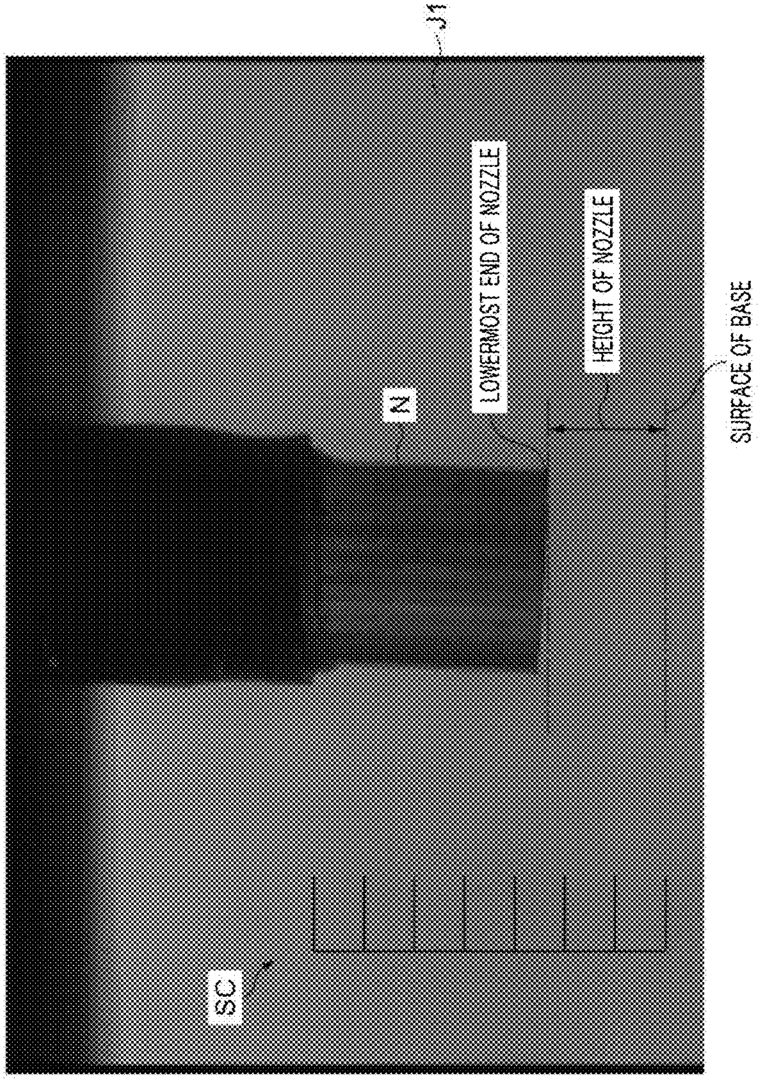
FIG. 7 is a diagram illustrating an example of a taken image for describing a method of calculating a height of the nozzle.

Thereafter, the height of the nozzle N is obtained by calculating a linear distance between the lowermost end of the nozzle N and a surface of the base J1. Specifically, the controller Ctr may calculate the height (mm) of the nozzle N by obtaining the number of pixels between the lowermost end of the nozzle N and the surface of the base J1 and multiplying a previously acquired length per pixel (mm/pixel) thereto. Alternatively, as illustrated in FIG. 7, an image obtained by imaging the nozzle N and a scale SC at the same time may be used, and the height of the nozzle N may be acquired as the operator reads the height of the lowermost end the nozzle N by using the scale SC. Here, the scale SC may be provided at the base J1 upwards from the surface of the base J1 such that it is located near the nozzle N or may be provided on a front surface of a lens of the imaging unit J2.

(B) Center Position of Leading End of Nozzle N

Hereinafter, as illustrated in FIG. 6, an example of calculating the center position of the leading end of the nozzle N based on the four images obtained by imaging the nozzle N with the imaging unit J2 from the different imaging positions P1 to P4 at the angular interval of approximately 90° will be described.

Figure 8A:
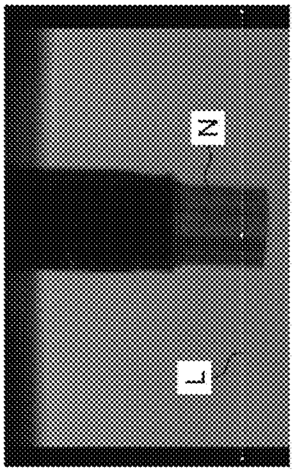
FIG. 8A to FIG. 8D are diagrams for describing a method of calculating a center position of a leading end of the nozzle.

First, a horizontal line L passing through the leading end of the nozzle N is designated in the image (for example, the image taken at the position of 0° around the rotation axis Ax) obtained by imaging the nozzle N from the imaging position P1 by the imaging unit J2 (see FIG. 8A). As a way to designate the horizontal line L, there may be adopted a method in which the operator observes the taken image and designates the leading end of the nozzle N, or a method in which the controller Ctr automatically determines the leading end of the nozzle N in the taken image by comparing the taken image with the previously acquired image of the leading end of the nozzle N by a commonly known image recognition technique.

Figure 8B:
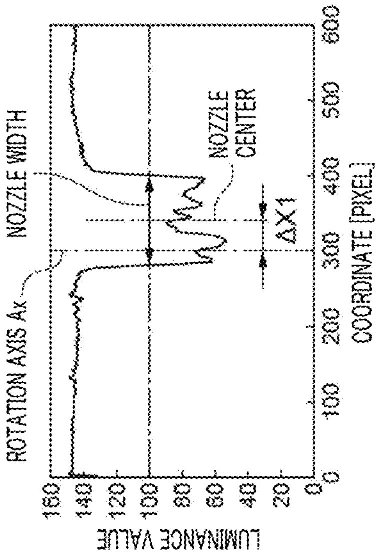
Figure 8C:
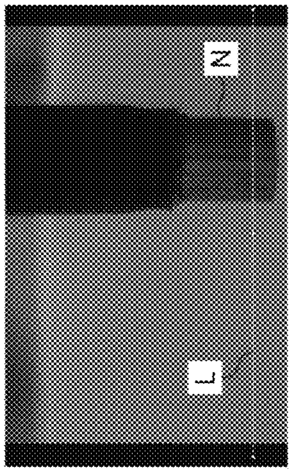
Figure 8D:
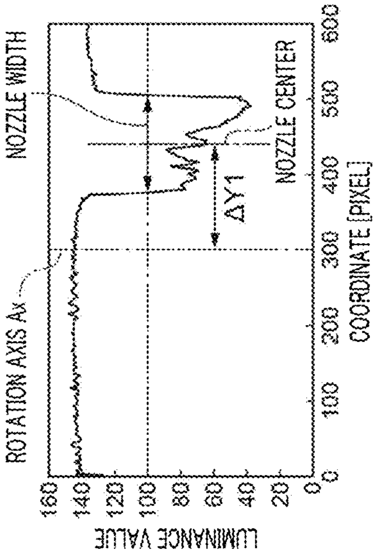

Then, the controller Ctr calculates a change in a luminance value in the horizontal line L (see FIG. 8B). In the example of FIG. 8A, since the luminance value of the nozzle N is smaller than that of the background, there can be made a determination that a coordinate at which the luminance value rapidly decreases indicates a side edge of the leading end of the nozzle N. In the example of FIG. 8B, two coordinates with the luminance value of 100 are determined as the side edges of the leading end of the nozzle N. A distance between these two coordinates is calculated as a width of the leading end of the nozzle N, and a coordinate of a midpoint of these two coordinates is obtained as the center position of the leading end of the nozzle N.

Next, the controller Ctr calculates a deviation ΔX1 between the coordinates of the rotation axis Ax in the taken image and the center of the leading end of the nozzle N. Further, although the coordinate of the rotation axis Ax in the taken image is 300 pixels in the example of FIG. 8B, it may be calculated as an average value of the coordinates of the center of the leading end of the nozzle N in a plurality of taken images.

Then, the controller Ctr performs the same processing as described above for the other taken images. Thus, based on the taken image obtained by imaging the nozzle N from the imaging position P2 by the imaging unit J2 (for example, the image taken at the position of 90° around the rotation axis Ax) (see FIG. 8C), the width of the leading end of the nozzle N, the center position of the leading end of the nozzle N, and a deviation ΔY1 are respectively calculated (see FIG. 8D).

Figure 9A:
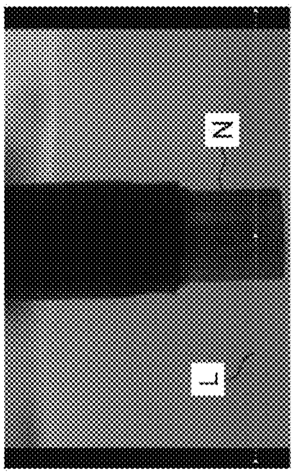
FIG. 9A to FIG. 9D are diagrams for describing a method of calculating the center position of the leading end of the nozzle.
Figure 9B:
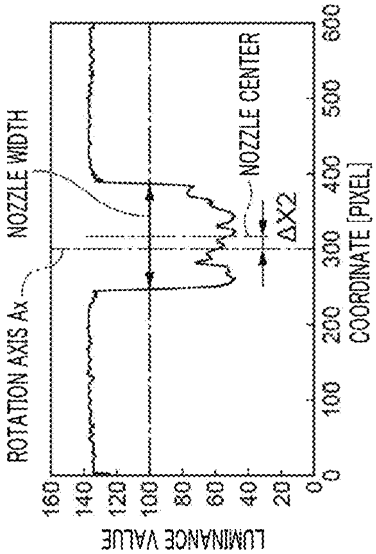
Figure 9C:
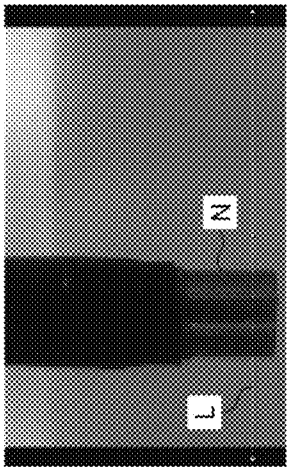
Figure 9D:
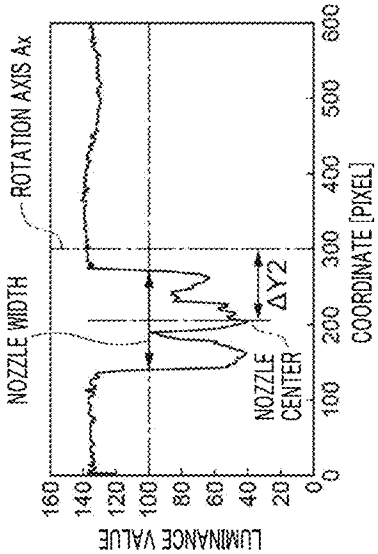

Further, based on the taken image obtained by imaging the nozzle N from the imaging position P3 by the imaging unit J2 (for example, the image taken at the position of 180° around the rotation axis Ax) (see FIG. 9A), the width of the leading end of the nozzle N, the center position of the leading end of the nozzle N, and a deviation ΔX2 are respectively calculated (see FIG. 9B). Moreover, based on the taken image obtained by imaging the nozzle N from the imaging position P4 by the imaging unit J2 (for example, the image taken at the position of 270° around the rotation axis Ax) (see FIG. 9C), the width of the leading end of the nozzle N, the center position of the leading end of the nozzle N, and a deviation ΔY2 are respectively calculated (see FIG. 9D).

Thereafter, the controller Ctr calculates the center position of the leading end of the nozzle N based on the calculated ΔX1, ΔX2, ΔY1, and ΔY2. Specifically, in the above-described example, since the four taken images obtained from the different imaging positions at the angular interval of 90° are used, an average value of ΔX1 and ΔX2 (=(ΔX1+ΔX2)/2) is calculated as a coordinate (pixel) in the X direction in the taken image, and an average value of ΔY1 and ΔY2 (=(ΔY1+ΔY2)/2) is calculated as a coordinate (pixel) in the Y direction in the taken image. Then, by multiplying by the previously acquired length per pixel (mm/pixel) to the coordinate (pixel) in the taken image, an actual coordinate (mm) of the center position of the leading end of the nozzle N is calculated.

Furthermore, the actual coordinate (mm) of the center position of the leading end of the nozzle N may be calculated based on at least two taken images obtained from different imaging positions. However, if at least three taken images obtained from different imaging positions are used, an error due to the rotation of the base J1 and an error in the image taken by the imaging unit J2 are smoothed out, so that the actual coordinate (mm) of the center position of the leading end of the nozzle N can be calculated with higher precision.

(C) Inclination of Nozzle N

In the following, as illustrated in FIG. 6, an example of calculating the inclination of the nozzle N based on the four images obtained by imaging the nozzle N with the imaging unit J2 from the different imaging positions P1 to P4 at the angular interval of approximately 90° will be described.

First, in the image taken by imaging the nozzle N from the imaging position P1 by the imaging unit J2 (for example, the image taken at the position of 0° around the rotation axis Ax), the controller Ctr specifies corner portions Q11 and Q12 constituting the leading end of the nozzle N (see FIG. 10A) by a commonly known image recognition technique. Next, the controller Ctr acquires the coordinates (pixels) of the corner portions Q11 and Q12 in the taken image, and calculates a perpendicular bisector H1 of a line segment connecting the portions Q11 and Q12 (see FIG. 10A). Then, the controller Ctr calculates an angle θ1 of the perpendicular bisector H1 with respect to a vertical line (see FIG. 10A).

Thereafter, the controller Ctr performs the same processing as described above for another taken image. In this way, based on the image taken by imaging the nozzle N from the imaging position P2 by the imaging unit J2 (for example, the image taken at the position of 90° around the rotation axis Ax), corner portions Q21 and Q22, a perpendicular bisector H2, and an angle θ2 are calculated (see FIG. 10B).

Figure 10A:
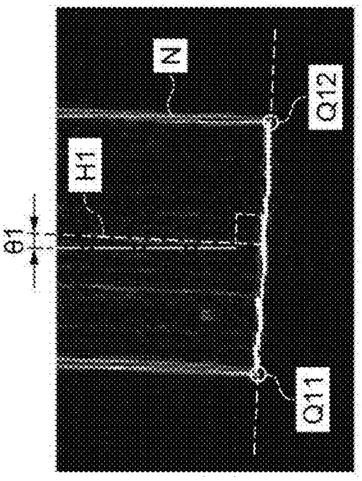
FIG. 10A to FIG. 10D are diagrams for describing a method of calculating an inclination of the nozzle.
Figure 10B:
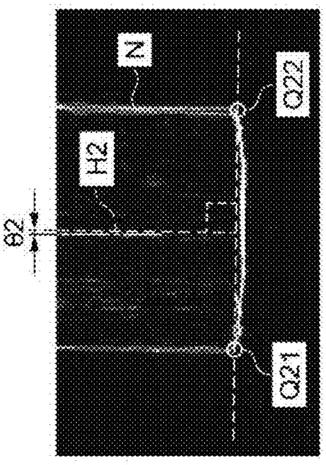
Figure 10C:
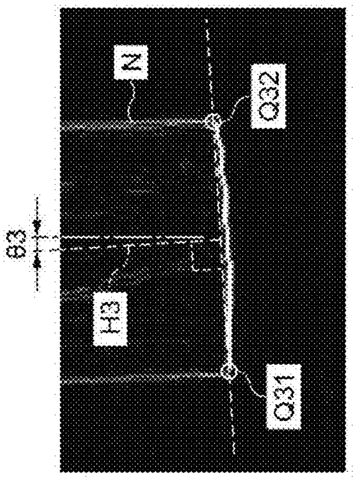
Figure 10D:
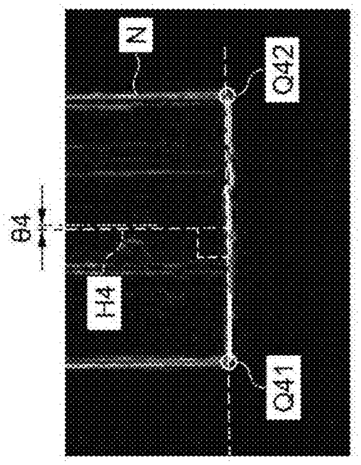
Figure 11:
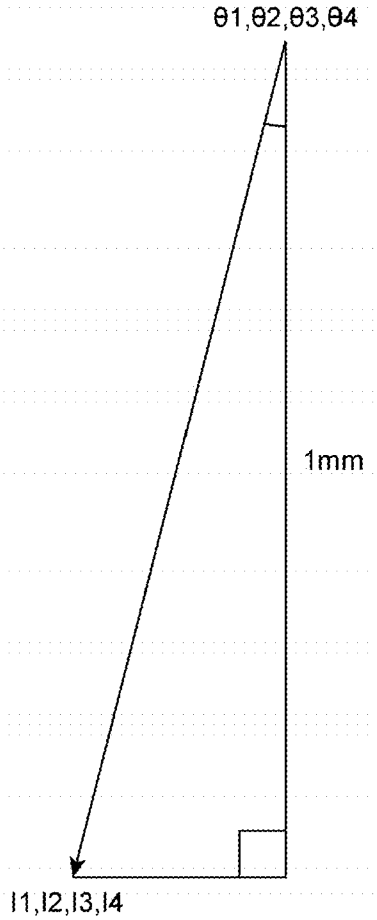
FIG. 11 is a diagram for describing a method of calculating a gradient vector of the nozzle.

Further, based on the image taken by imaging the nozzle N from the imaging position P3 by the imaging unit J2 (for example, the image taken at the position of 180° around the rotation axis Ax), corner portions Q31 and Q32, a perpendicular bisector H3, and an angle θ3 are calculated (see FIG. 10C). Furthermore, based on the image taken by imaging the nozzle N from the imaging position P4 by the imaging unit J2 (for example, the image taken at the position of 270° around the rotation axis Ax), corner portions Q41 and Q42, a perpendicular bisector H4, and an angle θ4 are calculated (see FIG. 10D).

Next, the controller Ctr calculates the inclination of the nozzle N based on the calculated angles θ1 to θ4. Specifically, the controller Ctr first calculates inclination amounts per unit height (for example, 1 mm), that is, gradient vectors I1 to I4, respectively, based on the angles θ1 to θ4 (see FIG. 11). Here, in the above-described example, since the four images taken from the different imaging positions at the angular interval of 90° are used, the Y coordinates of the gradient vectors I1 and I3 can be set to 0, and the X coordinates of the gradient vectors I2 and I4 can be set to 0. Therefore, the gradient vector I1 can be set to (Xi1, 0, 1); the gradient vector I2, (0, Yi2, 1); and the gradient vector I3, (Xi3, 0, 1); and the gradient vector I4, (0, Yi4, 1). By using a trigonometric ratio, Xi1 can be calculated to be tan θ1; Yi2, tan θ2; Xi3, tan θ3; and Yi4, tan θ4 (see FIG. 11). Then, the controller Ctr synthesizes the calculated gradient vectors I1 to I4 and calculates the inclination amount per unit height of the nozzle N, that is, the gradient vector I of the nozzle N.

In addition, the gradient vector I may be calculated based on at least two images taken from different imaging positions. If, however, at least three images taken from different imaging positions are used, the error due to the rotation of the base J1 and the error of the image taken by the imaging unit J2 are smoothed out, so that the gradient vector I can be calculated more precisely.

Subsequently, the controller Ctr calculates an expected liquid landing position of the processing liquid discharged from the nozzle N onto the front surface of the substrate W based on the posture of the nozzle N calculated in the process S4. (see process S5 of FIG. 5). For example, the controller Ctr may calculate the expected liquid landing position by using at least one of the height of the nozzle N, the actual coordinates of the center position of the leading end of the nozzle N, and the gradient vector I of the nozzle N calculated in the process S4.

Next, the controller Ctr calculates a deviation between the expected liquid landing position calculated in the process S5 and the rotation axis Ax (see process S6 of FIG. 5). Thereafter, the controller Ctr determines whether or not the deviation is within a preset allowable range (see process S7 of FIG. 5). The allowable range may be determined based on various factors such as, but not limited to, processing precision of the substrate W, a rotation speed during the processing of the substrate W, the type of the processing liquid, a discharge flow rate of the processing liquid, and so forth.

When the deviation does not fall within the preset allowable range (NO in process S7 of FIG. 5), the controller Ctr proceeds to a process S10 and sets forth an alarm indicating that the nozzle N needs to be adjusted. Based on the alarm, the operator may manually adjust the nozzle N, or the controller Ctr may automatically perform the adjustment of the nozzle N by controlling the individual components of the liquid processing unit U (for example, the driving unit 48). Thereafter, the controller Ctr controls the transfer arm A2 to carry out the inspection substrate J from the liquid processing unit U and transfer the inspection substrate J to the shelf unit 6 (see process S11 of FIG. 5).

Further, the controller Ctr may determine whether the posture of the nozzle N calculated in the process S4 (for example, the height of the nozzle N, the actual coordinates of the center position of the leading end of the nozzle N, the gradient vector I of the nozzle N, etc.) is within a preset allowable range. In this case as well, the controller Ctr may set forth an alarm when the posture of the nozzle N is not within the preset allowable range. Alternatively, when the posture of the nozzle N is not within the preset allowable range, the controller Ctr may perform the adjustment of the nozzle N automatically by controlling the individual components of the liquid processing unit U (for example, the driving unit 48 and so forth). In this case, maintenance of the nozzle N can be carried out efficiently.

Figure 12:
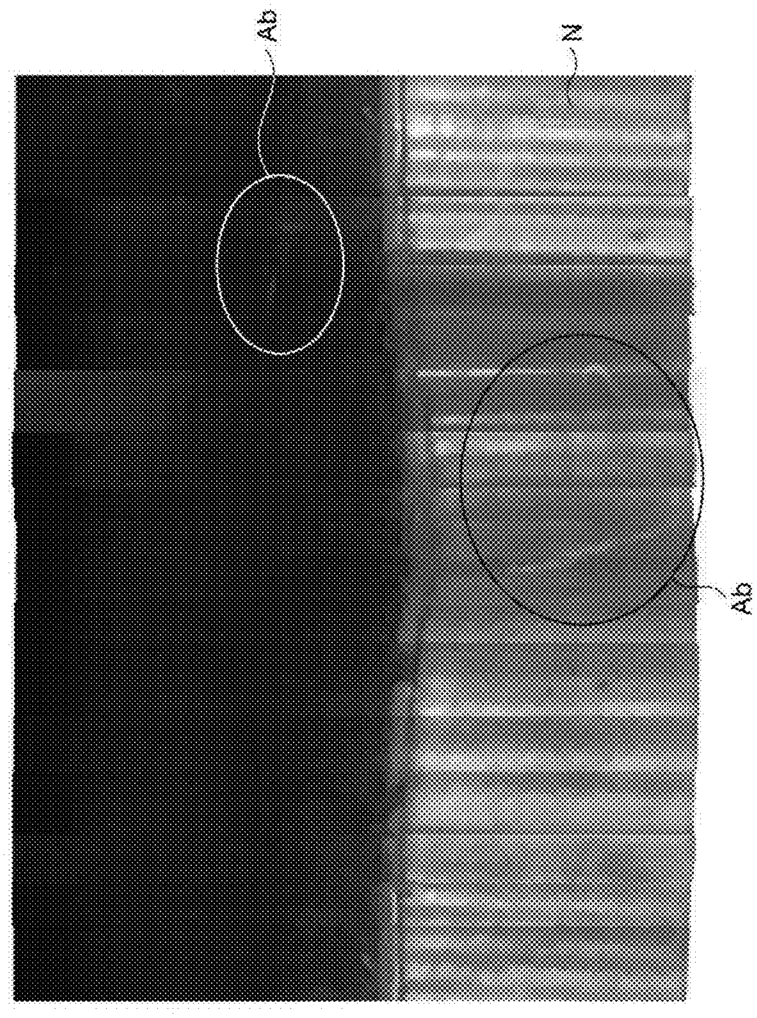
FIG. 12 is a diagram for describing a method of calculating an abnormality on a surface of the nozzle, which illustrates an example of an image prepared by developing an image taken over the substantially entire circumference of the nozzle into a plane.

On the other hand, if it is determined in the process S7 that the deviation is within the preset allowable range (YES in process S7 of FIG. 5), the controller Ctr detects presence or absence of an abnormality on the surface of the nozzle N (see process S8 of FIG. 5). In the following, as illustrated in FIG. 12, an example of detecting the presence or absence of the abnormality on the surface of the nozzle N based on the panoramic image of the entire circumference of the nozzle N will be discussed.

First, a panoramic image of the nozzle N with no abnormality is acquired as a reference image in advance. Next, the controller Ctr calculates a corrected image by performing subtraction of a luminance value for each pixel located at corresponding coordinates in the reference image and a panoramic image to be inspected. Next, the controller Ctr processes the corrected image by using a commonly known edge detection technique, and calculates a size of a region where an edge is emphasized. Next, the controller Ctr determines whether or not the size of the region falls within a preset allowable range. When the size of the region is not within the preset allowable range, the controller Ctr makes a determination that an abnormality Ab (see FIG. 12) occurs in the nozzle N. Further, the reference image may be obtained by averaging luminance values of all the pixels in the panoramic image to be inspected. Alternatively, the panoramic image to be inspected may be directly processed by using the commonly known edge detection technique without using the reference image.

If it is determined that the abnormality Ab occurs in the nozzle N (NO in process S9 of FIG. 5), the controller Ctr proceeds to the process S10, and sets forth an alarm indicating that the nozzle N has an abnormality. If the alarm is set forth, the operator may replace the nozzle N with a new nozzle N. Alternatively, when the abnormality Ab of the nozzle N is a deposit adhering to the surface of the nozzle N, the controller Ctr may control the individual components of the liquid processing unit U to supply at least one of the processing liquid or the cleaning liquid to the nozzle N to thereby remove the deposit from the nozzle N.

Meanwhile, if it is determined in the process S9 that the nozzle N does not have any abnormality Ab (YES in process S9 of FIG. 5), the processing proceeds to the process S11 in which the controller Ctr controls the transfer arm A2 to carry out the inspection substrate J from the liquid processing unit U and transfer the inspection substrate J to the shelf unit 6. Through these operations, the inspection of the state of the nozzle N is ended.

Further, when the inspection of the state of the nozzle N of the one liquid processing unit U is finished, the inspection substrate J may not be returned to the shelf unit 6 but may be transferred to another liquid processing unit U to inspect the state of the nozzle N of the corresponding liquid processing unit U. Furthermore, whenever a predetermined number of substrates W are processed in the liquid processing unit U, the inspection substrate may be periodically carried into the liquid processing unit U to inspect the stat of the nozzle N. In this case, the controller Ctr may compare the current data of the state of the nozzle N with the previous data of the state of the nozzle N and determine whether the current state of the nozzle N is within the preset allowable range. If the current state of the nozzle N is not within the allowable range, the controller Ctr may set forth an alarm as in the process S10.

Effects

According to the above-described exemplary embodiment, by rotating the rotating/holding unit 30 in the state that the inspection substrate J is held by the rotating/holding unit, the position of the imaging unit J2 with respect to the nozzle N is adjusted to the preset imaging position. For this reason, since there exists no obstacle between the imaging unit J2 and the nozzle N as an imaging target, the nozzle N is imaged from an appropriate position. Therefore, it becomes possible to acquire the state of the nozzle N with high precision.

According to the above-described exemplary embodiment, the nozzle is imaged from the multiple imaging positions. Therefore, the state of the nozzle N can be acquired more precisely.

According to the above-described exemplary embodiment, the nozzle N may be imaged from the multiple imaging positions spaced apart from each other at the substantially equal interval in the rotational direction of the inspection substrate J. In this case, the outer peripheral surface of the nozzle N is imaged over the substantially entire circumference thereof. For this reason, it becomes possible to acquire the state of the nozzle N with higher precision.

According to the above-described exemplary embodiment, when imaging the nozzle N, the nozzle N can be located on the side of the rotation axis Ax of the rotating/holding unit 30 with respect to the imaging unit J2. In this case, even if the imaging unit J2 is rotated via the inspection substrate J, the position of the nozzle N with respect to the imaging unit J2 becomes difficult to change. For this reason, the nozzle N can be imaged continuously by the imaging unit J2 without needing to adjust the direction of the imaging unit J2 or the like.

According to the above-described exemplary embodiment, by image-processing the image taken by the imaging unit J2, the presence or absence of the abnormality on the surface of the nozzle N is detected. Thus, presence or absence of a deposit or a flaw on the surface of the nozzle N, presence or absence of deformation of the nozzle N, and so forth are detected. Therefore, by adjusting (for example, replacing, cleaning, etc.) the nozzle N based on the detection result, an influence on the substrate processing that might be caused by the abnormality on the surface of the nozzle N can be eliminated in advance.

According to the above-described exemplary embodiment, by comparing the image of the nozzle N obtained by the imaging unit J2 before the processing of the substrate W by the processing liquid is performed (that is, the image of the nozzle N with no abnormality) and the image of the nozzle N obtained by the imaging unit J2 after the processing of the substrate W by the processing liquid is performed, the presence or absence of the abnormality on the surface of the nozzle N is detected. Through this comparison of the two taken images, a location of the abnormality on the surface of the nozzle N becomes more conspicuous. Therefore, it becomes possible to detect the presence or absence of the abnormality on the surface of the nozzle N more accurately.

According to the above-described exemplary embodiment, by image-processing the image taken by the imaging unit J2, the posture of the nozzle N, that is, at least one of the height of the nozzle N, the center position of the leading end of the nozzle N in the horizontal direction, or the inclination of the nozzle N is detected. Therefore, the posture of the nozzle N can be specified based on the detection result.

According to the above-described exemplary embodiment, based on the detected posture of the nozzle N, the expected liquid landing position of the processing liquid discharged from the nozzle N on the front surface of the substrate W is calculated. Thus, it becomes possible to find out the expected liquid landing position in advance without actually discharging the processing liquid to the substrate W.

According to the above-described exemplary embodiment, the deviation between the calculated expected liquid landing position and the rotation axis Ax of the rotating/holding unit 30 is calculated. Thus, by adjusting the nozzle N based on the deviation, it is possible to align a landing position of the processing liquid from the nozzle N to the origin in advance without actually discharging the processing liquid to the substrate W.

According to the above-described exemplary embodiment, an alarm is set forth when it is determined that the calculated deviation falls outside the preset allowable range. Thus, it is possible to eliminate in advance an influence on the substrate processing that might be caused by the deviation.

According to the above-described exemplary embodiment, the light is radiated to the nozzle N from the illuminator J3 when the nozzle N is imaged by the imaging unit J2. Thus, the nozzle N can be imaged more clearly.

According to the above-described exemplary embodiment, the imaging unit J2 and the controller Ctr may be connected so as to communicate with each other wirelessly. In this case, since a communication cable need not be connected to the inspection substrate J, the rotation of the inspection substrate J by the rotating/holding unit 30 is less likely to be inhibited. Therefore, the degree of freedom in the imaging position of the nozzle N can be increased.

According to the above-described exemplary embodiment, the inspection substrate J includes the battery J4 configured to supply the electric power to the imaging unit J2 and to be rechargeable. Therefore, since a power cable does not need to be connected to the inspection substrate J, the rotation of the inspection substrate J by the rotating/holding unit 30 is less likely to be inhibited. Therefore, it becomes possible to improve the degree of freedom in the imaging position of the nozzle N.

According to the above-described exemplary embodiment, the inspection substrate J is transferred between the liquid processing unit U and the shelf unit 6 by the transfer arm A2. Thus, it is possible to retreat the inspection substrate J to the shelf unit 6 when the substrate processing by the liquid processing unit U is performed.

MODIFICATION EXAMPLES

It will be appreciated that the disclosure in the present specification is illustrative in all aspects and is not intended to be limiting. Various omissions, replacements and modifications may be made without departing from the scope and spirit of the claims.

(1) Although the above exemplary embodiment has been described for the example where the substrate processing system 1 is a substrate cleaning apparatus, the substrate processing system 1 may be a coating and developing apparatus. That is, the processing liquid supplied to the surface of the substrate W may be, by way of example, a coating liquid configured to form a film on the surface of the substrate W, or a developing liquid configured to develop a resist film.

Figure 13:
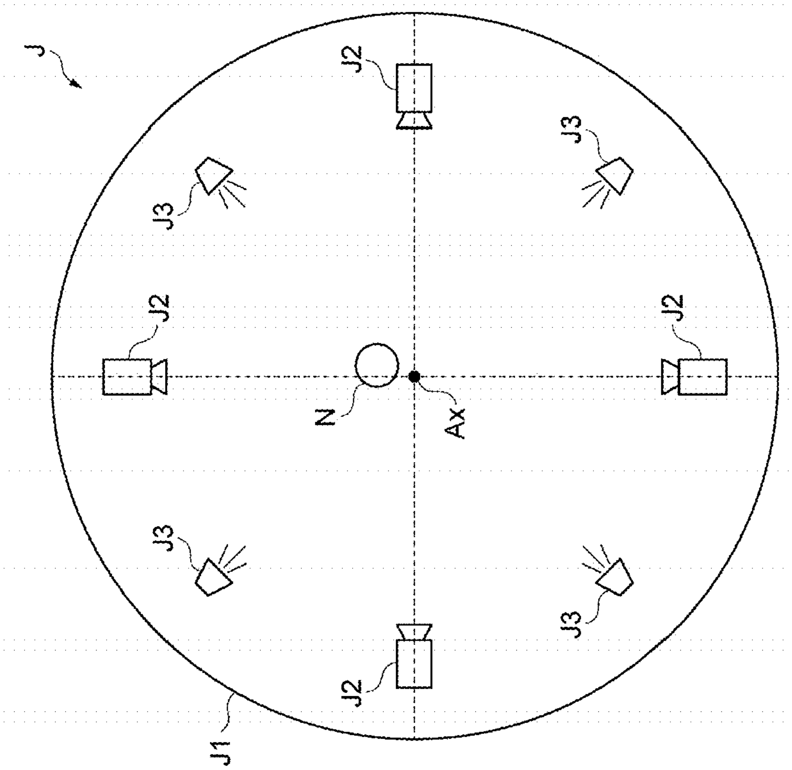
FIG. 13 is a top view illustrating another example of the inspection substrate.

(2) The inspection substrate J may not include the illuminator J3. Alternatively, the inspection substrate J may include a plurality of illuminators J3. In this case, as illustrated in FIG. 13, the illuminators J3 may be spaced apart from each other at an equal interval therebetween in the rotational direction of the inspection substrate J.

(3) The inspection substrate J may include a plurality of imaging units J2. In this case, as illustrated in FIG. 13, the plurality of imaging units J2 may be spaced apart from each other at a substantially equal interval therebetween in the rotational direction of the inspection substrate J. When the nozzle N is imaged by the plurality of imaging units J2, multiple portions of the nozzle N can be imaged at the same time by simply adjusting the positions of the plurality of imaging units J2 with respect to the nozzle N to predetermined imaging positions. Therefore, the state of the nozzle N can be acquired precisely and promptly.

(4) The imaging unit J2 may be disposed on the surface of the base J1 or embedded in the base J1.

(5) In the above-described exemplary embodiment, the state of the nozzle N through which the processing liquid or the cleaning liquid is discharged is inspected. However, a nozzle through which a gas (for example, a nitrogen gas) is discharged may be the target of the inspection.

(6) In the above-described exemplary embodiment, although the holder 33 attracts and holds the substrate W, the substrate W may be held mechanically.

(7) The controller Ctr may generate data of three-dimensional shape of the nozzle N by image-processing the multiple images that are obtained by imaging the nozzle N from different directions with the imaging unit J2 while changing the imaging position. In this case, based on the generated data of three-dimensional shape, the nozzle N can be observed in more detail. Therefore, it becomes possible to acquire the state of the nozzle N more precisely. Further, the data of three-dimensional shape of the nozzle N may be obtained by using a non-contact type 3D scanner instead of the imaging unit J2.

(8) The imaging unit J2 may image the nozzle N from which the processing liquid is being discharged. In this case, the state of the actual processing liquid discharged from the nozzle N can be checked. Thus, when the state of the nozzle N is abnormal, it becomes possible to find out the corresponding abnormality at an early stage. At this time, the imaging unit J2 may have a waterproof function, or the imaging unit J2 may be disposed at a position apart from the flow of the processing liquid in order to suppress adhesion of the processing liquid to the imaging unit J2.

Figure 14:
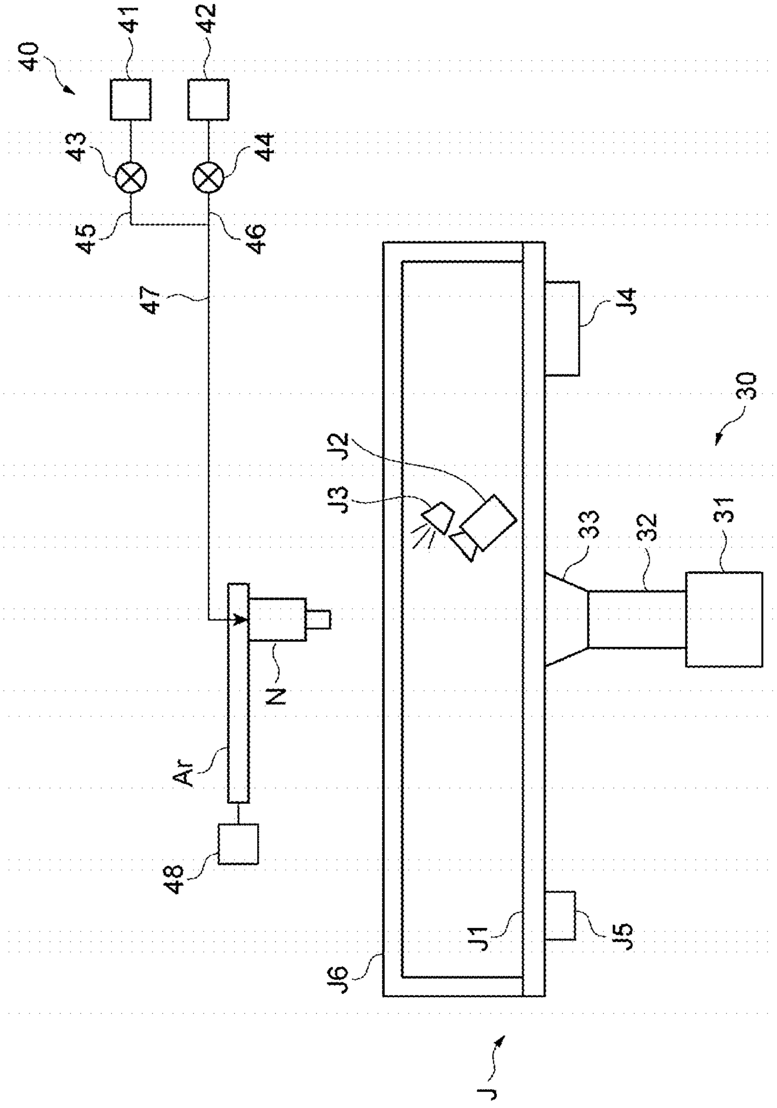
FIG. 14 is a side view illustrating yet another example of the inspection substrate.

Alternatively, as illustrated in FIG. 14, the inspection substrate J may include a transparent member J6 disposed at the base J1 to cover the imaging unit J2. In this case, the nozzle N is imaged by the imaging unit J2 via the transparent member J6. Thus, even if the processing liquid is dropped or discharged from the nozzle N, it is difficult for the processing liquid to adhere to the imaging unit J2 due to the presence of the transparent member J6. Therefore, it becomes possible to acquire the state of the nozzle N with high precision while protecting the imaging unit J2. In addition, imaging by the imaging unit J2 can be performed while the processing liquid is being discharged from the nozzle N. Thus, the actual landing position of the processing liquid on the substrate W can be found out. Additionally, the transparent member J6 may be made of a material (for example, quartz, resin, etc.) having chemical resistance to the processing liquid.

Figure 15:
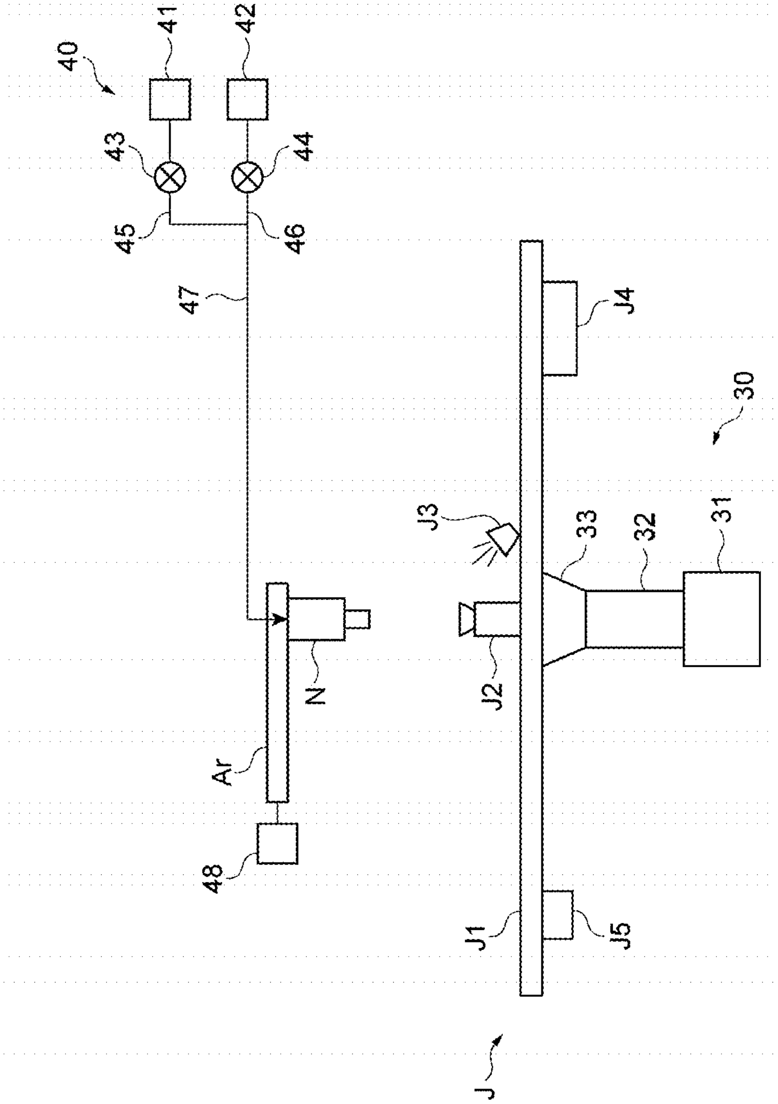
FIG. 15 is a side view illustrating still yet another example of the inspection substrate.

As shown in FIG. 15, the nozzle N may be imaged by the imaging unit J2 substantially from directly below. In this case as well, the center position of the leading end of the nozzle N and the presence or absence of the abnormality on the surface of the leading end of the nozzle N can be detected.

Other Examples

Example 1. An example of a substrate processing apparatus includes an inspection substrate including a base and an imaging unit disposed at the base; a holder configured to hold a substrate or the inspection substrate; a driving unit configured to rotate the holder; a processing liquid supply having a nozzle configured to discharge a processing liquid to the substrate held by the holder; and a controller. The controller is configured to perform: adjusting a position of the imaging unit with respect to the nozzle to a predetermined first imaging position by controlling the driving unit to rotate the holder in a state that the inspection substrate is held by the holder; and imaging, after the adjusting of the position of the imaging unit to the first imaging position, the nozzle at the first imaging position by controlling the imaging unit. According to the substrate processing apparatus described in Patent Document 1, however, the imaging device is disposed above the processing liquid supply nozzle and the scattering prevention cup. For this reason, when it is attempted to image the vicinity of a leading end of the nozzle, there is a likelihood that the processing liquid supply nozzle and the scattering prevention cup may become an obstacle, causing an imaging target portion to be blocked or not to be uniformly radiated with light. In such a case, the imaging target portion may not be imaged clearly. Furthermore, since the imaging needs to be performed while avoiding the processing liquid supply nozzle and the scattering prevention cup and an imaging direction is limited to being from obliquely above, there is a risk that the range of imaging is delimited. According to the apparatus of Example 1, however, the position of the imaging unit with respect to the nozzle is adjusted to the predetermined first imaging position by controlling the driving unit to rotate the holder in the state that the inspection substrate is held by the holder. Accordingly, since no obstacle exists between the imaging unit and the nozzle to be imaged, the nozzle is imaged from an appropriate position. Therefore, it becomes possible to acquire a state of the nozzle with high precision.

Example 2. In the substrate processing apparatus of Example 1, the controller may be configured to perform: adjusting, after the imaging of the nozzle at the first imaging position, the position of the imaging unit with respect to the nozzle to a second imaging position different from the first imaging position by controlling the driving unit to rotate the holder in the state that the inspection substrate is held by the holder; and imaging, after the adjusting of the position of the imaging unit to the second imaging position, the nozzle at the second imaging position by controlling the imaging unit. In this case, the nozzle is imaged from the multiple imaging positions. Thus, the state of the nozzle can be acquired with higher precision.

Example 3. In the substrate processing apparatus of Example 2, the controller may be configured to perform the adjusting of the position of the imaging unit to the first imaging position, the imaging of the nozzle at the first imaging position, the adjusting of the position of the imaging unit to the second imaging position, and the imaging of the nozzle at the second imaging position sequentially while controlling the driving unit to rotate the holder.

Example 4. In the substrate processing apparatus of Example 2 or 3, the controller may be configured to perform: adjusting, after the imaging of the nozzle at the second imaging position, the position of the imaging unit with respect to the nozzle to a third imaging position different from the first imaging position and the second imaging position by controlling the driving unit to rotate the holder in the state that the inspection substrate is held by the holder; and imaging, after the adjusting of the position of the imaging unit to the third imaging position, the nozzle at the third imaging position by controlling the imaging unit. The first imaging position, the second imaging position, and the third imaging position may be spaced apart from each other at a substantially equal interval therebetween in a rotational direction of the inspection substrate. In this case, the nozzle is imaged from the three imaging positions spaced apart from each other at the substantially equal distance therebetween in the rotational direction of the inspection substrate. That is, an outer peripheral surface of the nozzle is imaged over the substantially entire circumference thereof. Therefore, the state of the nozzle can be acquired with higher precision.

Example 5. In the substrate processing apparatus of Examples 2 to 4, the controller may be configured to perform generating three-dimensional shape data of the nozzle by image-processing multiple images obtained by the imaging unit. In this case, the nozzle can be observed more thoroughly based on the generated three-dimensional shape data. Therefore, it becomes possible to acquire the state of the nozzle more precisely.

Example 6. In the substrate processing apparatus of any one of Examples 1 to 5, when imaging the nozzle, the imaging unit may be located closer to an outer periphery of the base than the nozzle is. In this case, the nozzle is located on the rotation axis side of the holder with respect to the imaging unit. For this reason, even if the imaging unit is rotated via the inspection substrate, the position of the nozzle with respect to an imaging unit becomes difficult to change. Therefore, it becomes possible to continuously image the nozzle by the imaging unit without adjusting the direction of the imaging unit or the like.

Example 7. In the substrate processing apparatus of any one of Examples 1 to 6, the controller may be configured to perform detecting presence or absence of an abnormality on a surface of the nozzle by image-processing an image obtained by the imaging unit. In this case, presence or absence of a deposit or a flaw on the surface of the nozzle, presence or absence of a deformation of the nozzle, and the like are detected. Thus, by adjusting (for example, replacing, cleaning, etc.) the nozzle based on the detection result, an influence on a substrate processing that might be caused by the abnormality on the surface of the nozzle can be eliminated in advance.

Example 8. In the substrate processing apparatus of Example 7, the detecting of the presence or absence of the abnormality on the surface of the nozzle includes detecting the presence or absence of the abnormality on the surface of the nozzle by comparing an image obtained by the imaging unit before a processing of the substrate by the processing liquid is performed and an image obtained by the imaging unit after the processing of the substrate by the processing liquid is performed. In this case, through the comparison of the two taken images, a portion of the surface of the nozzle where the abnormality exists becomes more conspicuous. Therefore, it becomes possible to detect the presence or absence of the abnormality on the surface of the nozzle more accurately.

Example 9. In the substrate processing apparatus of any one of Examples 1 to 8, the controller may be configured to perform detecting a posture of the nozzle, that is, at least one of a height of the nozzle, a center position of a leading end of the nozzle in a horizontal direction, or an inclination of the nozzle by image-processing an image obtained by the imaging unit. In this case, the posture of the nozzle can be specified based on the detection result.

Example 10. In the substrate processing apparatus of Example 9, the controller may be configured to perform calculating an expected liquid landing position of the processing liquid discharged from the nozzle on a surface of the substrate based on the posture of the nozzle detected in the detecting of the posture of the nozzle. In this case, it becomes possible to find out the expected liquid landing position in advance without actually discharging the processing liquid to the substrate.

Example 11. In the substrate processing apparatus of Example 10, the controller may be configured to perform calculating a deviation between the expected liquid landing position calculated in the calculating of the expected liquid landing position and a rotation axis of the holder. In this case, by adjusting the nozzle based on the calculated deviation, it becomes possible to align the landing position of the processing liquid from the nozzle to an origin in advance without actually discharging the processing liquid to the substrate.

Example 12. In the substrate processing apparatus of Example 11, the controller may be configured to perform setting forth an alarm when the deviation calculated in the calculating of the deviation is found to be outside a set range. In this case, it becomes possible to eliminate beforehand an influence on the substrate processing that might be caused by the presence of the deviation.

Example 13. The substrate processing apparatus of Example 11 or 12 may further include a nozzle driving unit configured to change the posture of the nozzle. The controller may be configured to perform adjusting the posture of the nozzle such that the deviation falls within a set range by controlling the nozzle driving unit when it is determined that the deviation calculated in the calculating of the deviation is outside the set range. In this case, when the deviation falls outside the set range, the controller controls the posture of the nozzle automatically, so that maintenance of the nozzle can be performed efficiently.

Example 14. In the substrate processing apparatus of any one of Examples 1 to 13, the imaging of the nozzle at the first imaging position may include imaging, at the first imaging position, the nozzle from which the processing liquid is being discharged. In this case, the state of the actual processing liquid discharged from the nozzle can be checked. Thus, when the state of the nozzle is abnormal, it becomes possible to find out the abnormality at an early stage.

Example 15. In the substrate processing apparatus of any one of Examples 1 to 14, the inspection substrate may include a transparent member disposed to cover the imaging unit. The imaging of the nozzle at the first imaging position may include imaging the nozzle at the first imaging position through the transparent member. In this case, even if the processing liquid is dropped or discharged from the nozzle, the presence of the transparent member makes it difficult for the processing liquid to adhere to the imaging unit. Thus, it becomes possible to acquire the state of the nozzle with high precision while protecting the imaging unit. In addition, imaging by the imaging unit can be performed in the state that the processing liquid is being discharged from the nozzle. Therefore, it becomes possible to find out the actual liquid landing position of the processing liquid on the substrate.

Example 16. In the substrate processing apparatus of any one of Examples 1 to 15, the inspection substrate may include an illuminator disposed at the base. The illuminator may be configured to radiate light to the nozzle when the imaging unit images the nozzle. In this case, the nozzle can be imaged more clearly.

Example 17. In the substrate processing apparatus of any one of Examples 1 to 16, the inspection substrate may include an additional imaging unit disposed at a position of the base different from where the imaging unit is disposed. In this case, the nozzle is imaged by the multiple imaging units. For this reason, only by adjusting the positions of the imaging units with respect to the nozzle to predetermined imaging positions, it is possible to image multiple portions of the nozzle simultaneously. Therefore, the state of the nozzle can be acquired precisely and promptly.

Example 18. In the substrate processing apparatus of any one of Examples 1 to 17, the imaging unit and the controller may be connected to communicate with each other wirelessly. In this case, since a communication cable does not need to be connected to the inspection substrate, rotation of the inspection substrate by the holder is less likely to be hindered. Therefore, the degree of freedom in the imaging position of the nozzle can be improved.

Example 19. In the substrate processing apparatus of any one of Examples 1 to 18, the inspection substrate may include a battery configured to supply electric power to the imaging unit and configured to be recharged. In this case, since a power cable does not need to be connected to the inspection substrate, the rotation of the inspection substrate by the holder is less likely to be inhibited. Therefore, the degree of freedom in the imaging position of the nozzle can be improved.

Example 20. In the substrate processing apparatus of any one of Examples 1 to 19, the substrate processing apparatus may further include a processing chamber configured to accommodate therein the holder, the driving unit, and the nozzle; an accommodation chamber configured to accommodate therein the inspection substrate; and a transfer device configured to transfer the inspection substrate between the processing chamber and the accommodation chamber. In this case, when the substrate processing by the processing chamber is performed, it is possible to retreat the inspection substrate to the accommodation chamber.

Example 21. An example of a substrate processing method includes holding, with a holder, an inspection substrate having a base and an imaging unit disposed at the base; adjusting a position of the imaging unit with respect to a nozzle of a processing liquid supply to a predetermined first imaging position by rotating the holder after the holding of the inspection substrate; imaging the nozzle at the first imaging position after the adjusting of the position of the imaging unit; carrying out the inspection substrate from the holder after the imaging of the nozzle; holding a substrate with the holder after the carrying out of the inspection substrate; and processing the substrate by supplying a processing liquid to the substrate from the processing liquid supply through the nozzle after the holding of the substrate. In this case, the same effects as obtained in the substrate processing apparatus of Example 1 can be achieved.

With the substrate processing apparatus and the substrate processing method according to the exemplary embodiment, it is possible to acquire the state of the nozzle with high precision.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A substrate processing apparatus, comprising:
an inspection substrate including a base and an imaging unit disposed at the base;
a holder configured to hold a substrate or the inspection substrate;
a driving unit configured to rotate the holder;
a processing liquid supply having a nozzle configured to discharge a processing liquid to the substrate held by the holder; and
a controller,
wherein the controller is configured to perform:
adjusting a position of the imaging unit with respect to the nozzle to a predetermined first imaging position by controlling the driving unit to rotate the holder in a state that the inspection substrate is held by the holder;
imaging, after the adjusting of the position of the imaging unit to the first imaging position, the nozzle at the first imaging position by controlling the imaging unit,
adjusting, after the imaging of the nozzle at the first imaging position, the position of the imaging unit with respect to the nozzle to a second imaging position different from the first imaging position by controlling the driving unit to rotate the holder in a state in which the inspection substrate is held by the holder; and
imaging, after the adjusting of the position of the imaging unit to the second imaging position, the nozzle at the second imaging position by controlling the imaging unit.

2. The substrate processing apparatus of claim 1,
wherein the controller is configured to perform the adjusting of the position of the imaging unit to the first imaging position, the imaging of the nozzle at the first imaging position, the adjusting of the position of the imaging unit to the second imaging position, and the imaging of the nozzle at the second imaging position sequentially while controlling the driving unit to rotate the holder.

3. The substrate processing apparatus of claim 1,
wherein the controller is configured to perform:
adjusting, after the imaging of the nozzle at the second imaging position, the position of the imaging unit with respect to the nozzle to a third imaging position different from the first imaging position and the second imaging position by controlling the driving unit to rotate the holder in the state that the inspection substrate is held by the holder; and
imaging, after the adjusting of the position of the imaging unit to the third imaging position, the nozzle at the third imaging position by controlling the imaging unit, and
wherein the first imaging position, the second imaging position, and the third imaging position are spaced apart from each other at a substantially equal interval therebetween in a rotational direction of the inspection substrate.

4. The substrate processing apparatus of claim 1,
wherein the controller is configured to perform generating three-dimensional shape data of the nozzle by image-processing multiple images obtained by the imaging unit.

5. The substrate processing apparatus of claim 1,
wherein, when imaging the nozzle, the imaging unit is located closer to an outer periphery of the base than the nozzle is.

6. The substrate processing apparatus of claim 1,
wherein the controller is configured to perform detecting presence or absence of an abnormality on a surface of the nozzle by image-processing an image obtained by the imaging unit.

7. The substrate processing apparatus of claim 6,
wherein the detecting of the presence or absence of the abnormality on the surface of the nozzle comprises detecting the presence or absence of the abnormality on the surface of the nozzle by comparing an image obtained by the imaging unit before a processing of the substrate by the processing liquid is performed and an image obtained by the imaging unit after the processing of the substrate by the processing liquid is performed.

8. The substrate processing apparatus of claim 1,
wherein the controller is configured to perform detecting a posture of the nozzle, that is, at least one of a height of the nozzle, a center position of a leading end of the nozzle in a horizontal direction, or an inclination of the nozzle by image-processing an image obtained by the imaging unit.

9. The substrate processing apparatus of claim 8, further comprising:
a nozzle driving unit configured to change the posture of the nozzle,
wherein the controller is configured to perform:
calculating an expected liquid landing position of the processing liquid discharged from the nozzle on a surface of the substrate based on the posture of the nozzle detected by image-processing an image obtained by the imaging unit;
calculating a deviation between the expected liquid landing position calculated in the calculating of the expected liquid landing position and a rotation axis of the holder; and
controlling the nozzle driving unit to adjust the posture of the nozzle based on the deviation calculated in the calculating of the deviation when it is determined that the deviation is outside a set range.

10. The substrate processing apparatus of claim 9,
wherein the controller is configured to perform setting forth an alarm when the deviation calculated in the calculating of the deviation is found to be outside a set range.

11. The substrate processing apparatus of claim 1,
wherein the imaging of the nozzle at the first imaging position comprises imaging, at the first imaging position, the nozzle from which the processing liquid is being discharged.

12. The substrate processing apparatus of claim 1,
wherein the inspection substrate comprises a transparent member disposed to cover the imaging unit, and
the imaging of the nozzle at the first imaging position comprises imaging the nozzle at the first imaging position through the transparent member.

13. The substrate processing apparatus of claim 1,
wherein the inspection substrate comprises an additional imaging unit disposed at a position of the base different from where the imaging unit is disposed.

14. The substrate processing apparatus of claim 1,
wherein the imaging unit and the controller are connected to communicate with each other wirelessly.

15. The substrate processing apparatus of claim 1,
wherein the inspection substrate comprises a battery configured to supply electric power to the imaging unit and configured to be recharged.

16. The substrate processing apparatus of claim 1, further comprising:

a processing chamber configured to accommodate therein the holder, the driving unit, and the nozzle;

an accommodation chamber configured to accommodate therein the inspection substrate; and a transfer device configured to transfer the inspection substrate between the processing chamber and the accommodation chamber.

17. A substrate processing method, comprising:

holding, with a holder, an inspection substrate comprising a base and an imaging unit disposed at the base;

adjusting a position of the imaging unit with respect to a nozzle of a processing liquid supply to a predetermined first imaging position by rotating the holder after the holding of the inspection substrate;

imaging the nozzle at the first imaging position after the adjusting of the position of the imaging unit;

adjusting, after the imaging of the nozzle at the first imaging position, the position of the imaging unit with respect to the nozzle to a second imaging position different from the first imaging position by controlling a driving unit to rotate the holder in a state in which the inspection substrate is held by the holder;

imaging, after the adjusting of the position of the imaging unit to the second imaging position, the nozzle at the second imaging position by controlling the imaging unit, carrying out the inspection substrate from the holder after the imaging of the nozzle;

holding a substrate with the holder after the carrying out of the inspection substrate; and processing the substrate by supplying a processing liquid to the substrate from the processing liquid supply through the nozzle after the holding of the substrate.

* * * * *